(12) United States Patent
Steijaert et al.

(10) Patent No.: US 8,687,166 B2
(45) Date of Patent: Apr. 1, 2014

(54) LITHOGRAPHIC APPARATUS HAVING AN ENCODER POSITION SENSOR SYSTEM

(75) Inventors: Peter Paul Steijaert, Eindhoven (NL); Wilhelmus Josephus Box, Eksel (BE); Emiel Jozef Melanie Eussen, Eindhoven (NL); Erik Roelof Loopstra, Heeze (NL); Engelbertus Antonius Fransiscus Van Der Pasch, Oirschot (NL); Ruud Antonius Catharina Maria Beerens, Roggel (NL); Albertus Adrianus Smits, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 556 days.

(21) Appl. No.: 11/802,770

(22) Filed: May 24, 2007

(65) Prior Publication Data

US 2008/0291413 A1 Nov. 27, 2008

(51) Int. Cl.
*G03B 27/52* (2006.01)
*G03B 27/42* (2006.01)
*G03B 27/54* (2006.01)
*G03B 27/68* (2006.01)

(52) U.S. Cl.
USPC ............ 355/30; 355/52; 355/53; 355/55; 355/67

(58) Field of Classification Search
USPC .......... 355/53, 55, 30, 52, 67–71, 72–74, 77; 250/492.1, 492.2, 492.22, 548; 356/3.05, 9, 498, 614–616, 389, 356/399–401
See application file for complete search history.

(56) References Cited

U.S. PATENT DOCUMENTS

| | | | | |
|---|---|---|---|---|
| 4,769,680 A | | 9/1988 | Resor et al. | |
| 4,790,642 A | * | 12/1988 | Bruning et al. | 359/503 |
| 5,534,693 A | * | 7/1996 | Kondo et al. | 250/237 G |
| 5,574,560 A | * | 11/1996 | Franz et al. | 356/498 |
| 5,610,715 A | * | 3/1997 | Yoshii et al. | 356/499 |
| 5,877,843 A | * | 3/1999 | Takagi et al. | 355/30 |
| 5,995,198 A | * | 11/1999 | Mizutani | 355/53 |
| 6,125,092 A | * | 9/2000 | Takei et al. | 369/112.04 |
| 6,133,986 A | * | 10/2000 | Johnson | 355/67 |
| 6,285,444 B1 | * | 9/2001 | Osanai et al. | 355/72 |
| 6,645,701 B1 | | 11/2003 | Ota et al. | |

(Continued)

FOREIGN PATENT DOCUMENTS

| | | |
|---|---|---|
| JP | 06-291022 A | 10/1994 |
| JP | 09-148236 A | 6/1997 |

(Continued)

OTHER PUBLICATIONS

Final Rejection mailed Aug. 15, 2011, directed to related U.S. Appl. No. 12/153,799, filed May 23, 2008; 29 pages.

(Continued)

*Primary Examiner* — Toan Ton
*Assistant Examiner* — Christina Riddle
(74) *Attorney, Agent, or Firm* — Sterne, Kessler, Goldstein & Fox P.L.L.C.

(57) ABSTRACT

A lithographic apparatus is disclosed that includes an encoder type sensor system configured to measure a position of a substrate table of the lithographic apparatus relative to a reference structure. The encoder type sensor system includes an encoder sensor head and an encoder sensor target and the lithographic apparatus comprises a recess to accommodate the encoder sensor target.

20 Claims, 2 Drawing Sheets

(56) References Cited

U.S. PATENT DOCUMENTS

| | | | |
|---|---|---|---|
| 6,700,667 B2 | 3/2004 | Nishi | |
| 6,731,371 B1* | 5/2004 | Shiraishi | 355/30 |
| 6,831,744 B2* | 12/2004 | Masaki et al. | 356/400 |
| 7,025,498 B2 | 4/2006 | del Puerto | |
| 7,075,619 B2* | 7/2006 | Hill | 355/53 |
| 7,148,494 B2* | 12/2006 | Bruinsma et al. | 250/491.1 |
| 7,256,871 B2 | 8/2007 | Loopstra et al. | |
| 7,348,574 B2 | 3/2008 | Pril et al. | |
| 7,349,069 B2 | 3/2008 | Beems et al. | |
| 7,528,930 B2 | 5/2009 | Tokita | |
| 7,545,478 B2 | 6/2009 | Box et al. | |
| 2001/0013925 A1* | 8/2001 | Loopstra et al. | 355/30 |
| 2002/0018190 A1* | 2/2002 | Nogawa et al. | 355/30 |
| 2002/0041380 A1* | 4/2002 | Kwan | 356/616 |
| 2002/0097385 A1 | 7/2002 | Van Elp et al. | |
| 2002/0122186 A1* | 9/2002 | Igaki et al. | 356/616 |
| 2003/0179357 A1* | 9/2003 | Ravensbergen | 355/67 |
| 2004/0240513 A1 | 12/2004 | Del Puerto | |
| 2004/0263846 A1* | 12/2004 | Kwan | 356/399 |
| 2005/0168714 A1* | 8/2005 | Renkens et al. | 355/53 |
| 2005/0248739 A1* | 11/2005 | Box et al. | 355/30 |
| 2006/0119810 A1* | 6/2006 | Cadee | 355/30 |
| 2006/0139660 A1 | 6/2006 | Kwan | |
| 2007/0052976 A1* | 3/2007 | Pril et al. | 356/616 |
| 2007/0223007 A1* | 9/2007 | Klaver et al. | 356/499 |
| 2008/0278702 A1* | 11/2008 | Van Der Pasch et al. | 355/53 |
| 2009/0002653 A1 | 1/2009 | Steijaert et al. | |
| 2012/0075613 A1 | 3/2012 | Steijaert et al. | |

FOREIGN PATENT DOCUMENTS

| | | |
|---|---|---|
| JP | 10-177951 A | 6/1998 |
| JP | 11-097339 A | 4/1999 |
| JP | 2002-190438 A | 7/2002 |
| JP | 2004-304145 A | 10/2004 |
| JP | 2005-045215 A | 2/2005 |
| JP | 2005-086133 A | 3/2005 |
| JP | 2005-197447 A | 7/2005 |
| JP | 2005-322907 A | 11/2005 |
| JP | 2006-054452 A | 2/2006 |
| JP | 2006-303505 A | 11/2006 |
| JP | 2007-071874 A | 3/2007 |

OTHER PUBLICATIONS

Non-Final Rejection mailed Mar. 9, 2011, directed to related U.S. Appl. No. 12/153,799, filed May 23, 2008; 26 pages.

English-Language Abstract for Japanese Patent Publication No. 06-291022 A, published Oct. 18, 1994; 1 page.

English-Language Abstract for Japanese Patent Publication No. 11-097339 A, published Apr. 9, 1999; 1 page.

English-Language Abstract for Japanese Patent Publication No. 2002-190438 A, published Jul. 5, 2002; 1 page.

English-Language Abstract for Japanese Patent Publication No. 2004-304145 A, published Oct. 28, 2004; 1 page.

English-Language Abstract for Japanese Patent Publication No. 2005-086133 A, published Mar. 31, 2005; 1 page.

Non-Final Rejection mailed Nov. 5, 2013 for U.S. Appl. No. 12/153,799, filed May 23, 2008; 20 pages.

Non-Final Rejection mailed Jan. 8, 2014 for U.S. Appl. No. 13/308,388, filed Nov. 30, 2011; 16 pages.

\* cited by examiner

LITHOGRAPHIC APPARATUS HAVING AN ENCODER POSITION SENSOR SYSTEM

FIELD

The present invention relates to a lithographic apparatus and an encoder type position sensor system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, use may be made of an encoder type sensor system to measure a position of the substrate table with respect to a reference structure such as a metrology frame to which the projection optics may be connected. Such an encoder type sensor system may comprise an encoder sensor head and an encoder sensor target such as a grid plate, grating, etc.

SUMMARY

For the accuracy and stability of position measurements by an encoder type measurement system, position stability, geometric accuracy and stability of the encoder sensor target may play a role. Expansion of the encoder sensor target due to thermal effects caused by, for example, local heating, a gas stream, etc. may result in material expansion, mechanical tension, or other effects. Thus, accuracy of position measurement by an encoder type sensor system may be deteriorated.

Due to the increasing demands on density of integrated circuits, decreasing line widths, etc., requirements on the accuracy of the positioning of a substrate stage are increased. The situation is even more significant, as not only positioning accuracy needs to be increased, but at the same time the lithographic apparatus may need to provide the ability to handle large substrates, such as wafers having a larger diameter. Therefore, a range of movement of the substrate table as well as the size of the substrate table itself may be increased, which may translate into a larger size of the encoder sensor target. Also, a range of movement of the substrate stage may be further increased to provide increased flexibility in substrate handling, i.e. an ability of substrate swapping, exchanging, etc. These requirements may translate into a larger size of the encoder sensor target. A larger size of the encoder sensor target may aggravate the thermal and other effects described above.

To provide an idea of the thermal effects, if a stability of one nanometer would be required for the encoder sensor target, this may translate into a requirement to stabilize a temperature of the encoder sensor target within a temperature range of milli Kelvins or below, making use of common encoder sensor target materials used in this field.

Accordingly, it is desirable to increase position accuracy of an encoder type sensor system of the lithographic apparatus.

According to an embodiment of the invention, there is provided a lithographic apparatus, comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an encoder type sensor system configured to measure a position of the substrate table relative to a reference structure, the encoder type sensor system comprising an encoder sensor head and an encoder sensor target, and the lithographic apparatus comprises a recess to accommodate the encoder sensor target.

According to an embodiment of the invention, there is provided a lithographic apparatus, comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

an encoder type sensor system configured to measure a position of the substrate table relative to a reference structure, the encoder type sensor system comprising an encoder sensor head and an encoder sensor target; and a gas supply configured to provide a conditioned gas stream to a surface of the encoder sensor target, the surface being substantially parallel to a main plane of movement of the substrate table.

According to an embodiment of the invention, there is provided a lithographic apparatus, comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an encoder type sensor system configured to measure a position of the substrate table relative to a reference structure, the encoder type sensor system comprising an encoder sensor head and an encoder sensor target, wherein the lithographic apparatus is configured to move the substrate table in an idle time period along a main plane of movement of the substrate table, the moving of the substrate table to prevent a localized heating of the encoder sensor target by heat from the substrate table.

According to an embodiment of the invention, there is provided a lithographic apparatus, comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

an encoder type sensor system to measure a position of the substrate table relative to a reference structure, the encoder type sensor system comprising an encoder sensor head and an encoder sensor target; and a heat shielding layer between a stationary coil structure of a substrate table motor and the encoder sensor target.

According to an embodiment of the invention, there is provided a lithographic apparatus, comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an encoder type sensor system to measure a position of the substrate table relative to a reference structure, the encoder type sensor system comprising an encoder sensor head and an encoder sensor target, the encoder sensor target comprising a material having a substantially zero thermal expansion coefficient.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
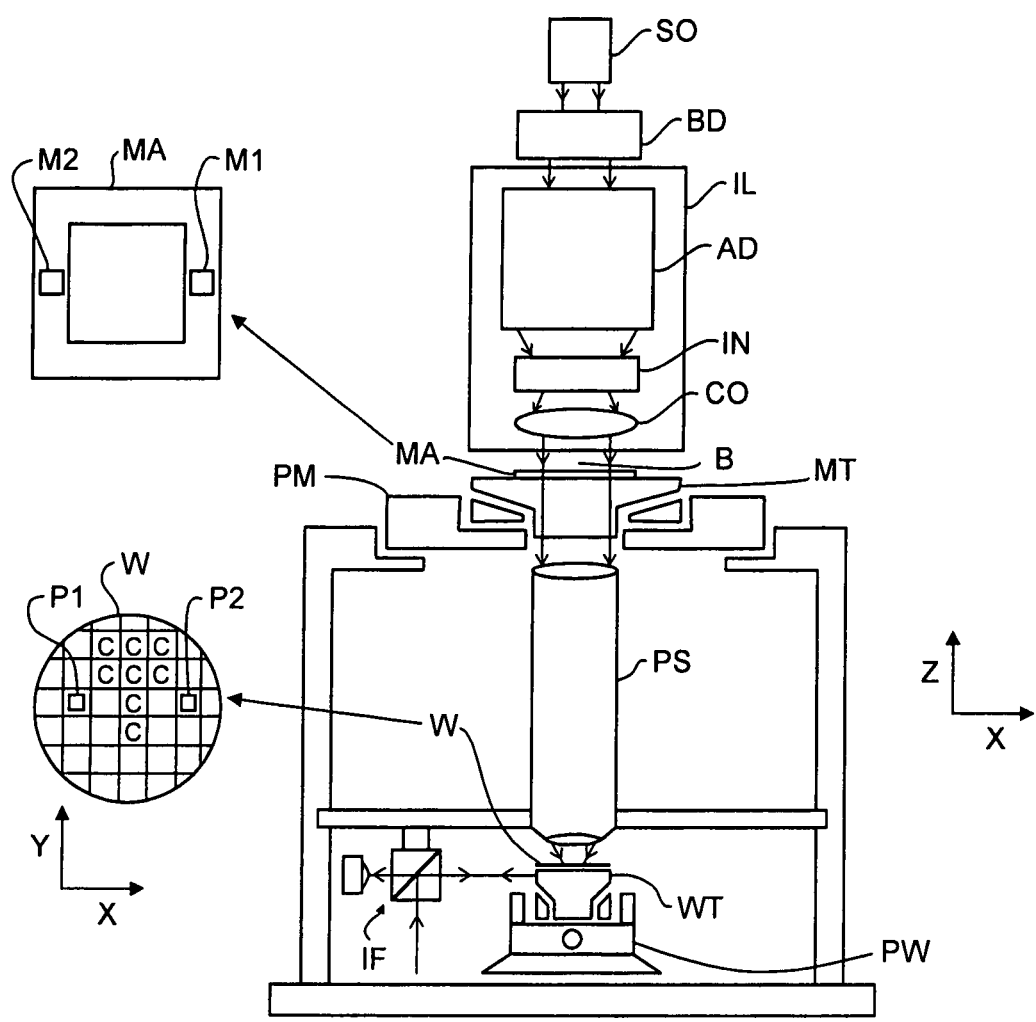
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support (e.g. a mask table) MT constructed to hold a patterning device (e.g. a mask) MA and connected to a first positioning device PM configured to accurately position the patterning device in accordance with certain parameters. The apparatus also includes a substrate table (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device supports). In such "multiple stage" machines the additional tables and/or supports may be used in parallel, or preparatory steps may be carried out on one or more tables and/or supports while one or more other tables and/or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate table WT are scanned synchronously while a pattern imparted to the radiation beam is projected onto a target portion C (i.e. a single dynamic exposure). The velocity and direction of the substrate table WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
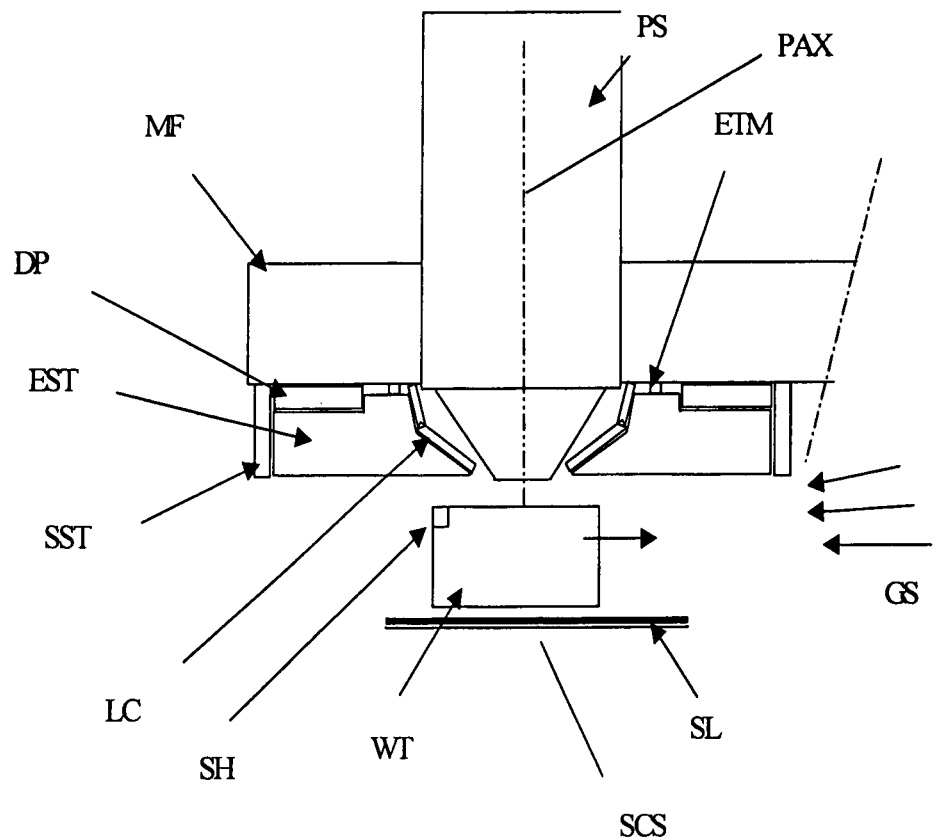
FIG. 2 depicts a highly schematic view of a part of a lithographic apparatus according to an aspect of the invention.

FIG. 2 shows a highly schematic partly cross-sectional view of a part of a lithographic apparatus showing a projection system PS which is positioned with respect to a reference structure, in this example a metrology frame MF. The projection system may be rigidly connected to the metrology frame, or connected to it in any other suitable way, e.g. by a resilient bearing, an active positioning system, etc. Contrary to the FIG. 1 embodiment, where an interferometer IF is depicted as a sensor system to measure a position of the substrate table, in this embodiment an encoder type sensor system is applied. The encoder type sensor system comprises an encoder sensor head SH, which is connected to the substrate table WT, and an encoder sensor target EST comprising, for example, a grid or grating. The encoder type sensor system is arranged to measure a position of the substrate table WT in a main plane of movement of the substrate table, i.e. a plane which is substantially perpendicular to the projection system optical axis PAX of the projection system PS. A recess is provided in which the encoder sensor target EST is accommodated. In this embodiment, the recess is provided on the reference structure (thus, in this example, on the metrology frame MF), however may in other embodiments be provided in or partly in the reference structure. By use of a recess, which will be described in more detail below, thermal stabilization of the encoder sensor target may be achieved, as the recess provides for a structure which may partly surround and/or shield the encoder sensor target. By use of a recess to accommodate the encoder sensor target, a gas stream along the encoder sensor target or part thereof may to a certain extent be prevented. Furthermore, a temperature of the encoder sensor target may be stabilized via the structure around it into which the recess is formed, etc.

The recess may be provided in any suitable way, e.g. by a recess in a separate member, such as a heat sink, temperature stabilizer, etc., however in the embodiment shown the recess is provided on the reference structure. By providing the recess on or in the reference structure (in this example the reference structure being formed by the metrology frame MF), a stable mechanical connection between the encoder sensor target and the reference structure may be provided so as to prevent position inaccuracies of the encoder sensor target with respect to the reference structure to a certain extent. The recess is, in this embodiment, further formed by a surrounding structure SST which is connected to a surface of the reference structure facing the encoder sensor target EST. The surrounding structure may (not shown in the partly cross sectional view of FIG. 2) at least partly surround a side of the encoder sensor target EST as seen in the main plane of movement of the substrate table WT.

In the embodiment shown, a gap is provided between the encoder sensor target EST and the recess, or strictly speaking a gap is provided between the encoder sensor target and the structure into which the recess is formed. By the gap, on the one hand mechanical contact between the structure into which the recess is formed, and the encoder sensor target may be prevented, which may suppress a transfer of, for example, vibrations or other disturbances toward the encoder sensor target, while on the other hand the surrounding structure into which the recess is provided provides for the stabilizing effects as mentioned above. A dimension of the gap may be designed to be smaller than substantially one millimeter, more desirably smaller than 50 micrometers, to provide for an adequate heat exchange. In the embodiment shown in FIG. 2, a suitable (nominal) dimension of the gap between the surrounding structure SST and the side of the encoder sensor target EST may be in the order of magnitude of 1-2 millimeters. By such an order of magnitude, a sufficiently large tolerance margin may be provided, as large parts may each have tolerances in an order of magnitude of several tens of millimeters, which may add to a total required tolerance margin of approximately in the order of one millimeter. A nominal gap in the above mentioned order of magnitude may thereby prevent a mechanical contact between both sides of the gap. The encoder sensor target EST is, in this example, mechanically connected to the metrology frame MF by a spring leaf connection, in this example provided by the encoder sensor target mounting ETM.

A further temperature stabilizing effect may be achieved if the reference structure, in this example the metrology frame MT, is provided with one or more liquid channels to circulate a temperature stabilizing liquid. For a further temperature stabilization, the reference structure, the surrounding structure SST, or both, may be provided with one or more channels to circulate a temperature stabilizing liquid. To provide an adequate thermal conductivity, the surrounding structure SST may comprise aluminum.

The reference structure, in this example the metrology frame MF, may be provided with one or more elements DP, such as aluminum elements, facing at least a part of a backside of the encoder sensor target EST. These elements are in the embodiment depicted here mounted on the surface of the metrology frame ME. A gap between the element(s) DP and the backside of the encoder sensor target EST may be less than 50 micrometers to provide for an adequate heat exchange. The element(s) DP, also referred to as a damping element, may provide damping of mechanical resonance or vibration of the encoder sensor target EST, as movement of the encoder sensor target (in particular a movement in the vertical direction) may involve a gas stream flowing in the narrow gap between the damping element(s) DP and the encoder sensor target EST, thereby providing for a damping by a gas in the gap. On the other, hand, a small gap may allow a good thermal heat exchange between the damping element(s) DP and the encoder sensor target EST, which may enhance a thermal stabilization of the encoder sensor target EST by providing the damping element(s) DP with a good thermal conductivity (e.g. by manufacturing them out of a material having a high thermal conductivity such as a metal), and by a good thermal coupling between the damping element(s) DP and the reference structure, thus, in this example the metrology frame MF.

A lens conditioner, in FIG. 2 schematically depicted by LC, may be provided to condition a downstream lens of the projection system, e.g. by providing a gas stream flowing along a surface of the downstream projection lens and/or by using liquid conditioning of a material of the conditioner. The lens conditioner LC may provide a side of the recess, as schematically indicated in FIG. 2. Thus, the lens conditioner may not only provide a stabilizing effect to a surface of a downstream lens of the projection system PS by providing a gas flow along the surface of that lens, but may also serve as a structure which is in thermal contact with a part of the encoder sensor target EST to stabilize a temperature thereof. A suitable distance between the encoder sensor target and the lens conditioner may be in the order of magnitude of millimeters or less.

FIG. 2 further schematically depicts a gas stream GS which may be provided by a gas supply, the gas stream being directed along a surface of the encoder sensor target, the surface being substantially parallel to the main plane of movement of the substrate table WT. By the gas stream, a stabilization of the temperature of the encoder sensor target EST along a surface thereof facing the substrate table WT, may be provided. The gas supply may be combined with the recess as described above and as also depicted in FIG. 2, however the recess and the gas supply may also be applied separately.

The lithographic apparatus may further be arranged (e.g. programmed) to move the substrate table in an idle time period (e.g. in a time period outside a substrate irradiation cycle, stepping cycle, etc.) along the main plane of movement of the substrate table to prevent a localized heating of the encoder sensor target by heat from the substrate table, for example from a substrate table motor, i.e. a motor driving the substrate table. Particularly in the case of a stationary coil type motor, a large amount of heat may be generated which may result in a flow of heat towards the encoder sensor target EST. An effect thereof may be reduced by moving the substrate table so as to generate a stream of gas and to prevent a localized heating (including a localized diminished heating) of the encoder sensor target.

Further, desirably but not necessarily in combination with the moving of the substrate table in an idle time period, a heat shielding layer may be provided between a stationary coil structure of the substrate table motor and the encoder sensor target. In the example shown in FIG. 2, the shielding layer SL is provided on the stationary coil structure SCS. The shielding layer SL and/or the moving of the substrate table in an idle time period may or may not be combined with the recess and/or the gas stream as described above.

In addition or alternatively to the ways to stabilize the encoder sensor target as described above, the encoder sensor target may comprise a material having a substantially zero thermal expansion coefficient to prevent an expansion thereof due to temperature effects. An example of such material may be Zerodur™ ceramic. Other examples may include Clearceram™ and Cordurite™ ceramics.

Figure 3:
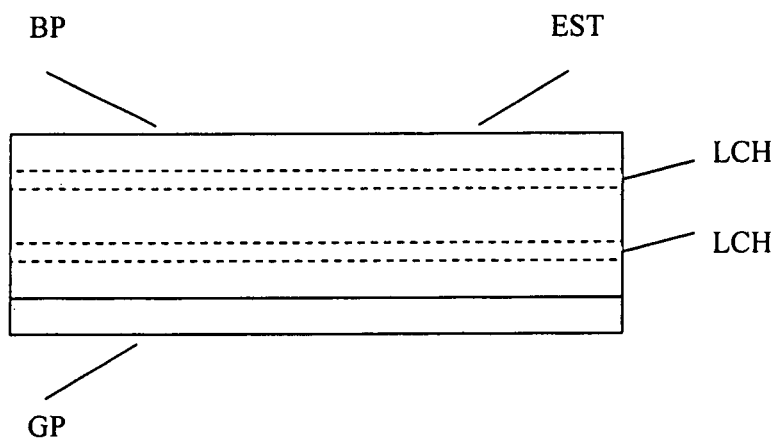
FIG. 3 depicts a highly schematic view of an encoder sensor target of a lithographic apparatus according to an aspect of the invention.

As an additional or alternative temperature stabilization mechanism, referring to FIG. 3, a liquid channel LCH may be provided in the encoder sensor target EST to circulate a temperature stabilizing liquid. The encoder sensor target may comprise a grating plate GP and a back plate BP into which the one or more liquid channels LCH are provided. Thereby, deformation or other undesired effects during a manufacturing of the encoder sensor target may to be reduced by using one or more liquid channels included on the encoder sensor target back plate. The grating plate may be connected to the back plate by optical contacting to provide a stable connection on the one hand and a good thermal contact between the grating plate and the back plate on the other hand. Optical contacting, which is normally used to provide optical effects, and which may be known to the skilled person under the term "ansprengen", provides for a virtually atomic contact between the surfaces of the back plate BP and the grating plate GP.

As mentioned above, each of the features described may be applied on its own, however a combination of two or more of the above features may be provided to stabilize the encoder sensor target, thereby possibly improving an accuracy of the position measurement of the substrate table WT by the encoder type sensor system. By such increased stability, a time interval between successive calibrations of the encoder type sensor system may be increased, which may be considered advantageous as such calibration well require the lithographic apparatus to be taken out of a production process in which it is employed. In a practical embodiment, a size of the encoder system target (in the main plane of movement of the substrate table), may be in an order of magnitude of one meter by one meter, while the features disclosed above may provide for a stability of the encoder system target, and thus the accuracy of the encoder type sensor system, in the nanometer or sub-nanometer range. It is noted that the drawings, particular FIG. 2, may not be drawn to scale. While the encoder sensor target has been shown as connected to the reference structure and the encoder sensor head as connected to the substrate table, the opposite may be true in an embodiment, i.e., the encoder sensor target connected to the substrate table and the encoder sensor head connected to the reference structure. Moreover, an embodiment has been described with respect to the substrate table but the teachings herein may be applied to other structure, such as a patterning device support, another movable part of the lithographic apparatus, or a movable part of another machine.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   a support constructed to hold a patterning device, the patterning device configured to pattern a radiation beam to form a patterned radiation beam;
   a substrate table constructed to hold a substrate;
   a projection system configured to project the patterned radiation beam onto a target portion of the substrate;
   an encoder sensor system configured to measure a position of the substrate table relative to a reference structure, the encoder sensor system comprising an encoder sensor head and an encoder sensor target, and
   a lens conditioner configured to condition a downstream lens of the projection system,
   wherein the encoder sensor target is positioned within a recess of the reference structure,
   wherein the recess is formed between a surrounding structure coupled to a surface of the reference structure, the surrounding structure located between the support and the lens conditioner and surrounding at least part of the encoder sensor target, the lens conditioner further configured to provide a side of the recess.

2. The lithographic apparatus according to claim 1, wherein the encoder sensor target is configured and arranged such that there is:
   a first gap between the encoder sensor target and the reference structure; and
   a second gap between a side of the encoder sensor target and the surrounding structure.

3. The lithographic apparatus according to claim 2, wherein the first gap is less than 1 millimeter.

4. The lithographic apparatus according to claim 2, wherein the second gap is 1 to 2 millimeters.

5. The lithographic apparatus according to claim 1, wherein the reference structure, the surrounding structure, or both the reference and surrounding structures, is provided with a cooling channel to circulate a temperature stabilizing liquid.

6. The lithographic apparatus according to claim 1, wherein the surrounding structure comprises aluminum.

7. The lithographic apparatus according to claim 1, wherein the reference structure comprises an aluminum element facing at least a part of a backside of the encoder sensor target, a gap between the aluminum element and the backside of the encoder sensor target being less than 50 micrometers.

8. The lithographic apparatus according to claim 1, wherein a gap between the lens conditioner and a side of the encoder sensor target facing the lens conditioner is in the order of magnitude of millimeters or less.

9. The lithographic apparatus according to claim 1, wherein the position is in a main plane of movement of the substrate table.

10. The lithographic apparatus of claim 1, wherein the reference structure is a metrology frame.

11. A lithographic apparatus, comprising:
a support constructed to hold a patterning device, the patterning device configured to pattern a radiation beam to form a patterned radiation beam;
a substrate table constructed to hold a substrate;
a projection system configured to project the patterned radiation beam onto a target portion of the substrate;
an encoder sensor system configured to measure a position of the substrate table relative to a reference structure, the encoder sensor system comprising an encoder sensor head and an encoder sensor target; and
a gas supply configured to provide a conditioned gas stream to a surface of the encoder sensor target, the surface being substantially parallel to a main plane of movement of the substrate table,
wherein the encoder sensor target is positioned within a recess of the reference structure, and
wherein the recess is formed between a surrounding structure coupled to a surface of the reference structure, the surrounding structure located between the support and a lens conditioner and surrounding at least part of the encoder sensor target, the lens conditioner configured to provide a side of the recess.

12. A lithographic apparatus, comprising:
a support constructed to hold a patterning device, the patterning device configured to pattern a radiation beam to form a patterned radiation beam;
a substrate table constructed to hold a substrate;
a projection system configured to project the patterned radiation beam onto a target portion of the substrate; an encoder sensor system configured to measure a position of the substrate table relative to a reference structure, the encoder sensor system comprising an encoder sensor head and an encoder sensor target,
wherein the lithographic apparatus is configured to move the substrate table in an idle time period along a main plane of movement of the substrate table, thereby preventing a localized heating of the encoder sensor target by heat from the substrate table, and
wherein the encoder sensor target is positioned within a recess of the reference structure, and
wherein the recess is formed between a surrounding structure coupled to a surface of the reference structure, the surrounding structure located between the support and a lens conditioner and surrounding at least part of the encoder sensor target, the lens conditioner configured to provide a side of the recess.

13. A lithographic apparatus, comprising:
a support constructed to hold a patterning device, the patterning device configured to pattern a radiation beam to form a patterned radiation beam;
a substrate table constructed to hold a substrate;
a projection system configured to project the patterned radiation beam onto a target portion of the substrate;
an encoder sensor system to measure a position of the substrate table relative to a reference structure, the encoder sensor system comprising an encoder sensor head and an encoder sensor target; and
a heat shielding layer between a stationary coil structure of a substrate table motor and the encoder sensor target,
wherein the encoder sensor target is positioned within a recess of the reference structure, and
wherein the recess is formed between a surrounding structure coupled to a surface of the reference structure, the surrounding structure located between the support and a lens conditioner and surrounding at least part of the encoder sensor target, the lens conditioner configured to provide a side of the recess.

14. A lithographic apparatus, comprising:
a support constructed to hold a patterning device, the patterning device configured to pattern a radiation beam to form a patterned radiation beam;
a substrate table constructed to hold a substrate;
a projection system configured to project the patterned radiation beam onto a target portion of the substrate; and
an encoder sensor system to measure a position of the substrate table relative to a reference structure, the encoder sensor system comprising an encoder sensor head and an encoder sensor target,
wherein the encoder sensor target comprises a material having a substantially zero thermal expansion coefficient, and
wherein the encoder sensor target is positioned within a recess of the reference structure, and
wherein the recess is formed between a surrounding structure coupled to a surface of the reference structure, the surrounding structure located between the support and a lens conditioner and surrounding at least part of the encoder sensor target, the lens conditioner configured to provide a side of the recess.

15. The lithographic apparatus according to claim 14, wherein the encoder sensor target comprises a liquid channel configured to circulate a temperature stabilizing liquid.

16. The lithographic apparatus according to claim 15, wherein the encoder sensor target comprises a grating plate and a back plate, the liquid channel being provided in the back plate.

17. The lithographic apparatus according to claim 16, wherein the grating plate is connected to the back plate by optical contacting.

18. A lithographic apparatus, comprising:
a support constructed to hold a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate; and an encoder sensor system to measure a position of the substrate table relative to a reference structure, the encoder sensor system comprising an encoder sensor head and an encoder sensor target, wherein the reference structure comprises a hollowed-out section that defines a recess within the reference structure, and wherein the encoder sensor target is positioned within the recess of the reference structure.

19. The lithographic apparatus according to claim 18, wherein the encoder sensor target is configured and arranged such that there is:

a first gap between the encoder sensor target and a base of the reference structure; and a second gap between a side of the encoder sensor target and the surrounding structure of the reference structure.

20. The lithographic apparatus according to claim 19, wherein:

the first gap is less than 1 millimeter; and the second gap is 1 to 2 millimeters.

* * * * *